United States Patent
Domanski et al.

(10) Patent No.: US 8,456,785 B2
(45) Date of Patent: Jun. 4, 2013

(54) SEMICONDUCTOR ESD DEVICE AND METHOD

(75) Inventors: Krzysztof Domanski, Munich (DE); Cornelius Christian Russ, Diedorf (DE); David Alvarez, Munich (DE); Wolfgang Soldner, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 260 days.

(21) Appl. No.: 12/911,582

(22) Filed: Oct. 25, 2010

(65) Prior Publication Data

US 2012/0099229 A1  Apr. 26, 2012

(51) Int. Cl.
*H02H 9/00* (2006.01)
*H02H 1/00* (2006.01)
*H02H 1/04* (2006.01)
*H02H 3/22* (2006.01)
*H02H 9/06* (2006.01)

(52) U.S. Cl.
USPC ............................................ 361/56; 361/118

(58) Field of Classification Search
None
See application file for complete search history.

(56) References Cited

U.S. PATENT DOCUMENTS

| | | | |
|---|---|---|---|
| 5,574,618 A | 11/1996 | Croft | |
| 5,880,488 A | 3/1999 | Yu | |
| 6,055,143 A | 4/2000 | Yu | |
| 6,353,237 B1 | 3/2002 | Yu | |
| 6,768,616 B2 | 7/2004 | Mergens et al. | |
| 6,803,633 B2 | 10/2004 | Mergens et al. | |
| 7,113,377 B2 | 9/2006 | Salome et al. | |
| 7,205,611 B2 | 4/2007 | Honjoh et al. | |
| 7,563,653 B2 | 7/2009 | Lee et al. | |
| 7,589,944 B2 | 9/2009 | Mergens et al. | |
| 7,800,128 B2 | 9/2010 | Domanski et al. | |
| 7,911,749 B2* | 3/2011 | Lai | 361/56 |
| 7,933,107 B2* | 4/2011 | Sugahara | 361/111 |
| 7,973,334 B2 | 7/2011 | Verleye et al. | |
| 8,102,001 B2 | 1/2012 | Ker et al. | |
| 2002/0041007 A1 | 4/2002 | Russ | |
| 2004/0164356 A1 | 8/2004 | Mergens et al. | |
| 2006/0011939 A1 | 1/2006 | Mohn et al. | |
| 2007/0002508 A1 | 1/2007 | Vanysacker et al. | |
| 2007/0058307 A1 | 3/2007 | Mergens et al. | |
| 2007/0236842 A1 | 10/2007 | Choi | |
| 2008/0001168 A1 | 1/2008 | Manna et al. | |

(Continued)

OTHER PUBLICATIONS

Caillard, B., et al., "STMSCR: A New Mulit-Finger SCR-Based Protection Structure Against ESD," Electrical Overstress/Electrostatic Discharge Symposium, Sep. 21-25, 2003, 9 pages.

(Continued)

*Primary Examiner* — Dharti Patel
(74) *Attorney, Agent, or Firm* — Slater & Matsil, L.L.P.

(57) ABSTRACT

An embodiment semiconductor device has a first device region disposed on a second device region within an ESD device region disposed within a semiconductor body. Also included is a third device region disposed on the second device region, a fourth device region adjacent to the second device region, a fifth device region disposed within the fourth device region, and a sixth device region adjacent to the fourth device region. The first and fourth regions have a first semiconductor type, and the second, third, fifth and sixth regions have a second conductivity type opposite the first conductivity type. An interface between the fourth device region and the sixth device region forms a diode junction. The first, second, fourth and fifth device regions form a silicon controlled rectifier.

27 Claims, 11 Drawing Sheets

U.S. PATENT DOCUMENTS

2009/0166671 A1    7/2009   Hwang
2010/0044748 A1    2/2010   Lin et al.
2011/0147794 A1    6/2011   Gauthier, Jr. et al.

OTHER PUBLICATIONS

Mergens, M. P. J., et al., "High Holding Current SCRs (HHI-SCR) for ESD Protection and Latch-up Immune IC Operation," Microelectronics Reliability, Jul. 2003, pp. 993-1000, vol. 43, Issue 7.

Litzenberger, M., et al., "Scanning Heterodyne Interferometer Setup for the Time-Resolved Thermal and Free-Carrier Mapping in Semiconductor Devices," IEEE Transactions on Instrumentation and Measurement, Dec. 2005, pp. 2438-2445, vol. 54, No. 6.

Pogany, D., et al., "Moving Current Filaments in ESD Protection Devices and Their Relation to Electrical Characteristics," IEEE International Reliability Physics Symposium Proceedings, Mar. 30-Apr. 4, 2003, pp. 241-248.

* cited by examiner

SEMICONDUCTOR ESD DEVICE AND METHOD

TECHNICAL FIELD

This invention relates generally to semiconductor devices and methods, and more particularly to an ESD protection device and method.

BACKGROUND

As electronic components are becoming smaller and smaller along with the internal structures in integrated circuits, it is becoming easier to either completely destroy or otherwise impair electronic components. In particular, many integrated circuits are highly susceptible to damage from the discharge of static electricity. Generally, electrostatic discharge (ESD) is the transfer of an electrostatic charge between bodies at different electrostatic potentials or voltages, caused by direct contact or induced by an electrostatic field. The discharge of static electricity, or ESD, has become a critical problem for the electronics industry.

Device failures resulting from ESD events are not always immediately catastrophic or apparent. Often, the device is only slightly weakened but is less able to withstand normal operating stresses. Such a weakened device may result in reliability problems. Therefore, various ESD protection circuits are typically included in circuits to protect its various components.

Silicon Controlled Rectifier (SCR) or thyristor devices are commonly used for Electrostatic-Discharge (ESD) protection. On one hand, the SCR provides a compact and effective structure for conducting the very large currents that are associated with ESD events. One the other hand, SCR devices are prone to high leakage currents, particularly at high temperatures, high latchup sensitivity due to low holding voltages, and high triggering voltages.

A transistor's physical size limits the voltage that the transistor can withstand without being damaged. Therefore, as the geometries of the transistors that make up integrated circuits are reduced, there is a corresponding reduction in transistor breakdown voltage. As such, the high triggering voltage of the SCR device poses a difficulty in providing ESD protection for densely populated integrated circuits. Furthermore, as semiconductor circuits become more targeted toward very low power and low voltage applications, however, the high leakage currents associated with SCR devices poses difficulties with power sensitive applications.

SUMMARY OF THE INVENTION

In an embodiment, a semiconductor device has a first device region of disposed on a second device region within an ESD device region disposed within a semiconductor body. Also included is a third device region disposed on the second device region, a fourth device region adjacent to the second device region, a fifth device region disposed within the fourth device region, and a sixth device region adjacent to the fourth device region. The first and fourth regions have a first semiconductor type, and the second, third, fifth and sixth regions have a second conductivity type opposite the first conductivity type. An interface between the fourth device region and the sixth device region forms a diode junction. The first device region is coupled to a first ESD node and the fifth device region is coupled to a second ESD node. The first, second, fourth and fifth device regions form a silicon controlled rectifier.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a silicon controlled rectifier (SCR) ESD structure. The invention may also be applied, however, to other semiconductor structures.

Figure 1A:
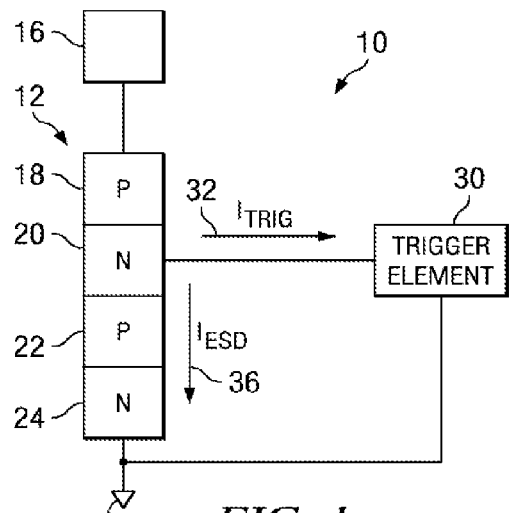
FIGS. 1a-1c illustrate an ESD device according to a conventional embodiment.

FIG. 1a illustrates a known ESD protection device 10. This circuit includes an SCR 12 that includes p-type anode 18, n-type cathode 24, n-type n-base SCR region 20, and p-type p-base SCR region 22. Anode 18 and trigger element 30 are coupled to a node to be protected 16 and reference node 34, which is typically ground. The trigger element 30 causes trigger current $I_{TRIG}$ 32 to flow whenever the voltage at node 16 exceeds a certain threshold. Typical required trigger thresholds are between 1V and 20V. The presence of a trigger current $I_{TRIG}$ 32 causes the SCR to conduct a large current, $I_{ESD}$ 36.

Figure 1B:
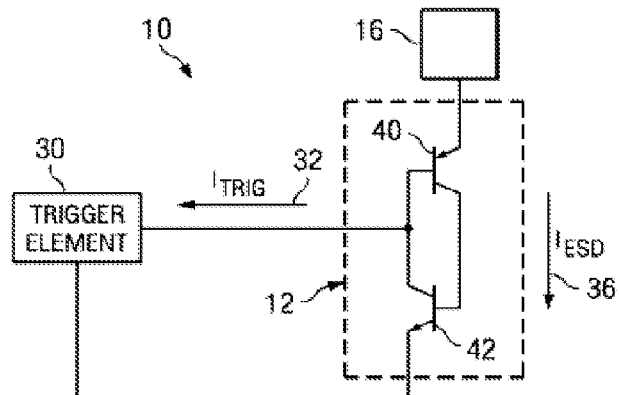

FIG. 1b is an equivalent circuit representation of ESD protection device 10 in a non-conducting state where the voltage at node 16 is less than the threshold of the trigger device and the SCR is not conducting a large current $I_{ESD}$ 36. In the non-conducting state, the SCR can be modeled as a bipolar latch that includes bipolar junction transistor (BJT) PNP device 40, and a BJT NPN device 42. The representative PNP device is made up of the p-type anode 18 as the emitter, the n-base region 20 as the base, and p-base region 22 as the collector. The representative NPN device is made up of n-base region 20 as the collector, p-base region 22 as the base, and n-type cathode 24 as the emitter. When trigger current $I_{TRIG}$ 32 flows from the base of representative PNP 40 in response to a voltage transient at node 16, the collector of the representative PNP 40 is pulled high, thereby turning on NPN 42, which pulls the base of PNP 40 down toward the potential at reference node 34. A large current $I_{ESD}$ 36 then flows though the bipolar latch modeled by transistors 40 and 42.

Figure 1C:
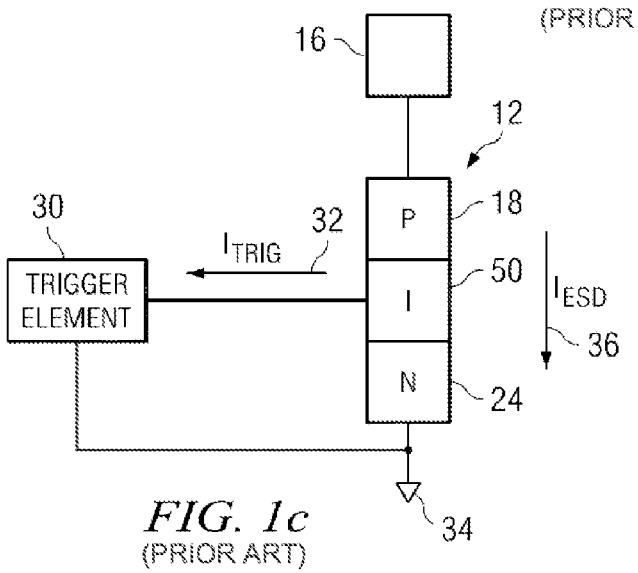

Turning to FIG. 1c, once the SCR 12 is latched, the SCR can be modeled as a forward biased PIN diode where the intrinsic region 50 includes n-base region 20 and p-base region 22. When the SCR 12 is turned on $I_{ESD}$ 36 will continue to flow even if $I_{TRIG}$ 32 is no longer applied. An SCR fabricated in a submicron process will typically conduct 10 mA to 100 mA per μm width. The SCR will stop conduction once $I_{ESD}$ 36 falls below a holding current, typically 1 μA to 1 mA per μm of width.

Figure 2A:
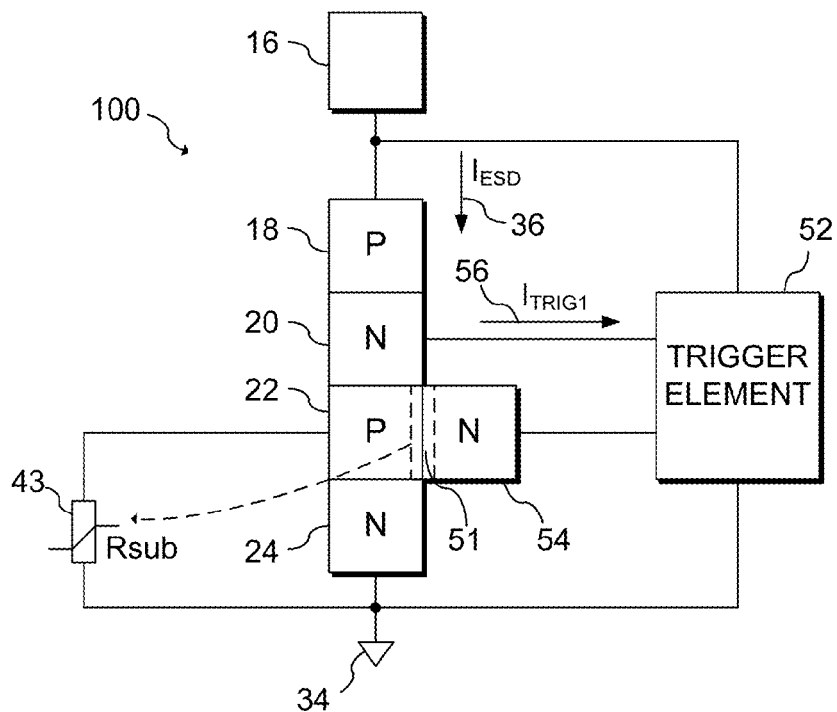
FIGS. 2a-2d illustrate ESD devices according to embodiments of the present invention.

FIG. 2a illustrates ESD protection device 100 according to an embodiment of the present invention. Protection device 100 has an SCR having anode 18, n-type trigger region 20, p-type trigger region 22 and n-type cathode 24. In addition, protection device 100 has n-type region 54 adjacent to p-type trigger region 22, where an interface between the n-type region 54 and p-type trigger region 22 forms diode junction 51. The diode formed at this junction is referred to as a shield diode. Trigger element 52 is coupled to n-type trigger region 56 and n-type region 54. Resistance $R_{sub}$ represents a substrate resistance to ground. In some embodiments, resistance 43 is a parasitic resistance of a p-type substrate. In further embodiments, resistance 43 is a parasitic resistance of other p-type layers besides the substrate, such as a well, epitaxial layer, or other layer.

During the operation of ESD protection device 100, trigger element 52 pulls n-type trigger region low, drawing current $I_{TRIG1}$ from the SCR. In addition, trigger element 52 pulls n-type region 54 high, which further reverse biases diode junction 51. As the bias voltage of a diode junction changes, resistance $R_{sub}$ changes. In one embodiment, resistance $R_{sub}$ increases monotonically to the reverse bias of diode junction 51. Furthermore, as the reverse bias across diode junction 51 increases, the magnitude of trigger current $I_{TRIG1}$ required to trigger the SCR decreases. In one embodiment the voltage across diode junction 51 is a reverse bias voltage. However, in alternative embodiments, diode junction 51 can be forward biased. In an embodiment, ESD protection device 100 having n-type region 54 and diode junction 51 triggers with a lower current than embodiments without n-type region 54 and diode junction 51, such as the embodiment shown in FIG. 1a.

Figure 2B:
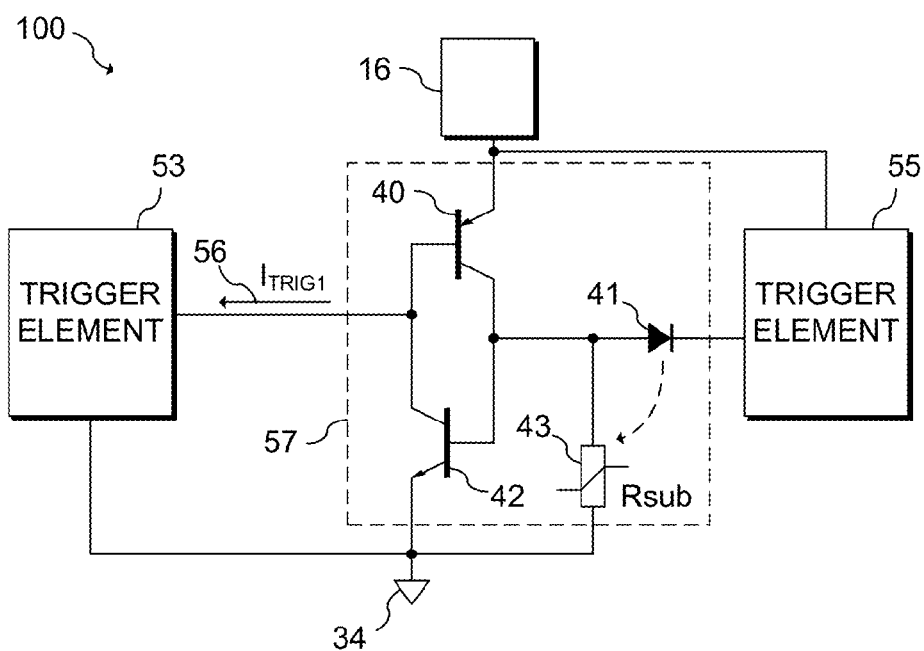

FIG. 2b illustrates a circuit model of embodiment ESD protection device 100. SCR 57 is modeled as representative PNP transistor 40, NPN transistor 42, diode 41 and substrate resistance 43. In an embodiment, trigger element 53 activates the SCR device by pulling the base of representative PNP transistor 40 low, while trigger element 55 pulls the cathode of diode 41 high, thereby lowering trigger current $I_{TRIG1}$.

Figure 2C:
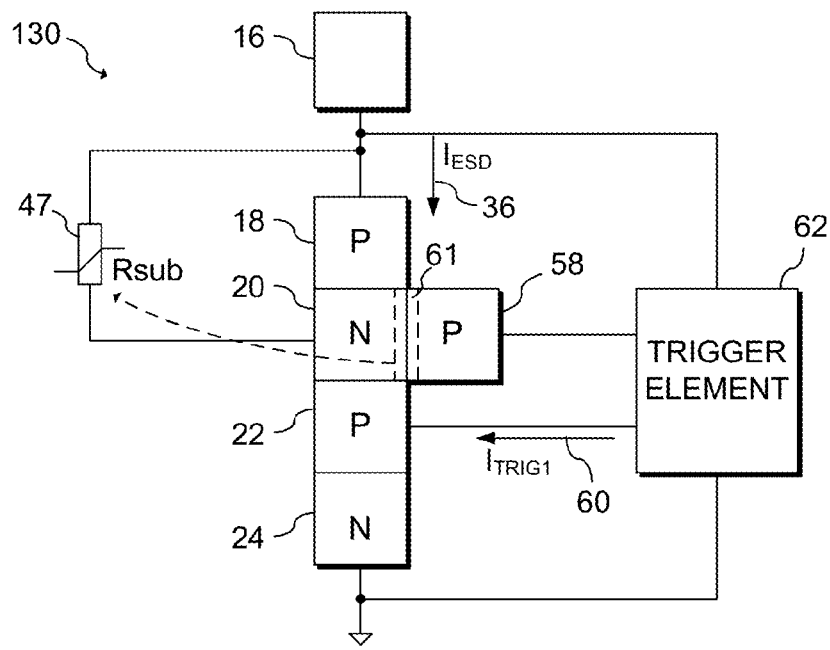

FIG. 2c illustrates ESD protection device 130 according to another embodiment of the present invention. Protection device 130 has an SCR having anode 18, n-type trigger region 20, p-type trigger region 22 and n-type cathode 24. In addition, protection device 100 has p-type region 58 adjacent to n-type trigger region 20, where an interface between the p-type region 58 and n-type trigger region 20 forms diode junction 61. Trigger element 62 is coupled to p-type trigger region 22 and p-type region 58. Resistance $R_{sub}$ represents a substrate resistance 47 to p-type anode region 18. In some embodiments, substrate resistance 47 represent a resistance of an n-type substrate. Alternatively, substrate resistance 47 can be the resistance of an n-well, epitaxial layer, or other n-type layer.

Figure 2D:
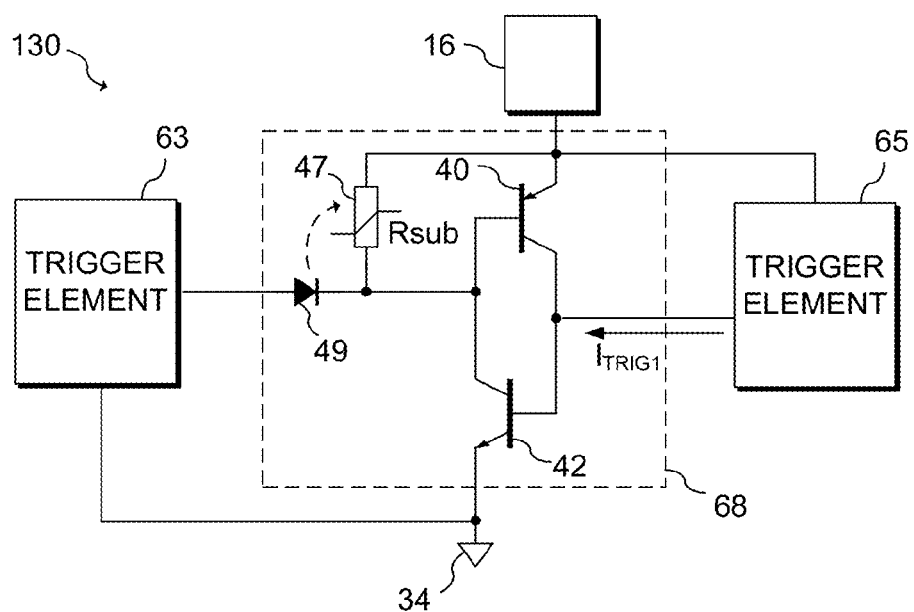

FIG. 2d illustrates a circuit model of embodiment ESD protection device 130. SCR 68 is modeled as representative PNP transistor 40, NPN transistor 42, diode 49 and substrate resistance 47. In an embodiment, trigger element 65 activates the SCR device by pulling the base of representative NPN transistor 42 high, while trigger element 63 pulls the anode of diode 49 low, thereby lowering trigger current $I_{TRIG1}$.

Figure 3A:
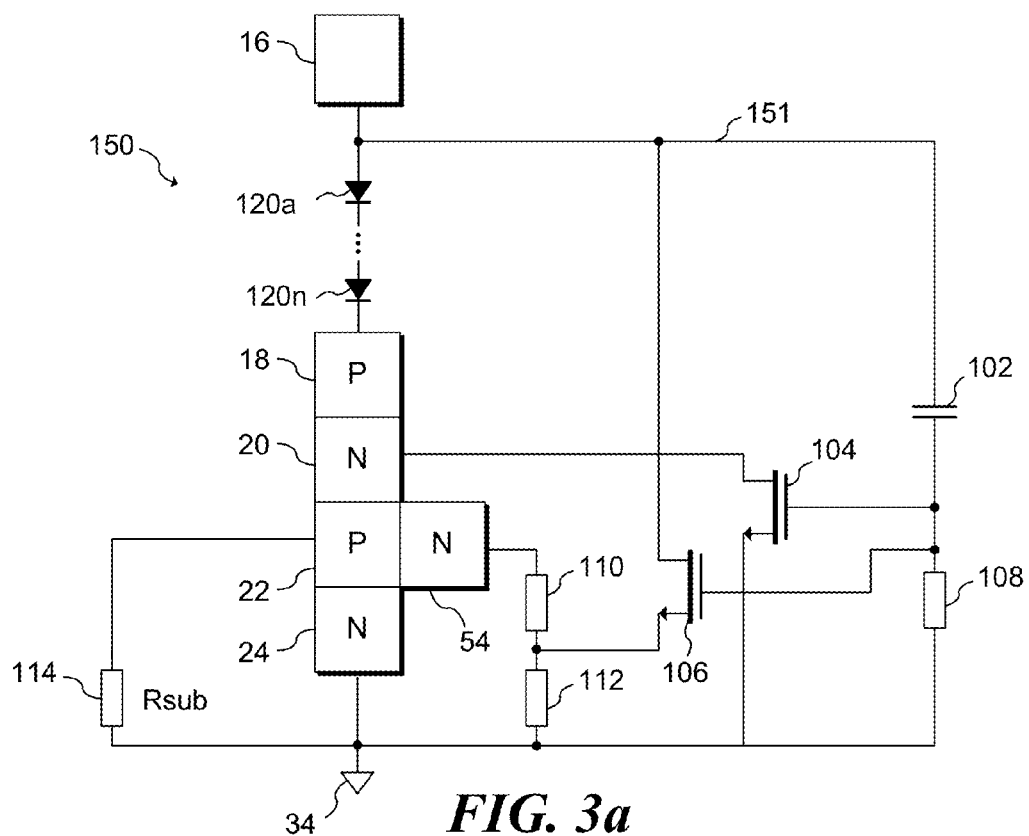
FIGS. 3a-3e illustrate ESD devices according to further embodiments of the present invention.

FIG. 3a illustrates embodiment ESD device having an SCR with n-type region 54 disposed adjacent to p-type trigger region 22. N-type trigger region 20 of the SCR is coupled to the drain of NMOS device 104, the gate of which is coupled to an RC network having capacitor 102 and resistor 108. During an ESD event, when node 151 is pulled high, the gates of NMOS devices 104 and 106 are pulled high via capacitor 102. NMOS device 104 sinks trigger current $I_{TRIG1}$ from n-type trigger region 20 of the SCR via the drain, and NMOS device 106 pulls n-type region 54 is pulled high via source. The action of both NMOS devices simultaneously draws trigger current $I_{TRIG1}$ from the SCR, while, at the same time, lowering trigger current $I_{TRIG1}$. Some embodiments using MOS type trigger devices have a relatively much lower leakage current, particularly at elevated temperatures, compared to devices that do not employ MOS type trigger devices. One reason for the lower leakage is that NMOS devices 104 and 106 have a much lower leakage than some non-MOS trigger devices (i.e. diodes), when the ESD device is in an inactive state.

In an embodiment, the source of NMOS device 106 is coupled to n-type region 54 via resistor 110 and coupled to ground via resistor 112. Trigger current $I_{TRIG1}$ can be adjusted by sizing resistors 110 and 112. In one embodiment, a low trigger current $I_{TRIG1}$ is set by using a low value of resistance for resistor 110, and a high value of resistance for resistor 112. In some embodiments, the value for resistor 110 can be as low as zero ohms, and the value for resistor 112 can very high, using, for an example an open circuit. In a further embodiment, a high trigger current $I_{TRIG1}$ is set by using a large value for resistor 110 and a low value for resistor 112. Furthermore, in case PN junction 51 is forward-biased by a positive potential at p-type region 22 with respect to n-type region 54, the n-type 54 injects electrons into the substrate causing an undesired current path, which is suppressed by resistor 110 and 112. In an embodiment, a further undesired current path into the source of NMOS 106 is suppressed by resistor 110.

In an embodiment, the RC time constant of resistor 108 and capacitor 102 is about 20 ns, however, in alternative embodiments, a higher or lower time constant can be used. In one embodiment, capacitor 102 is about 2 pF and resistor 108 is about 10 KΩ. Alternatively, other values can be used for capacitor 102 and resistor 108. In an embodiment, the RC time constant is chosen to be large enough to adequately couple the onset of an ESD event, yet be fast enough to recover from the ESD event once the ESD event has terminated. In a further embodiment, a separate RC circuit can be used for each of NMOS devices 104 and 106.

In an embodiment, one or more series diodes 120a to 120n are coupled between node 151 and p-type anode 18 of the SCR. Each diode coupled in series causes a corresponding increase of the trigger voltage of ESD device 150. In alternative embodiment, series diodes 120a to 120n can be omitted.

Figure 3B:
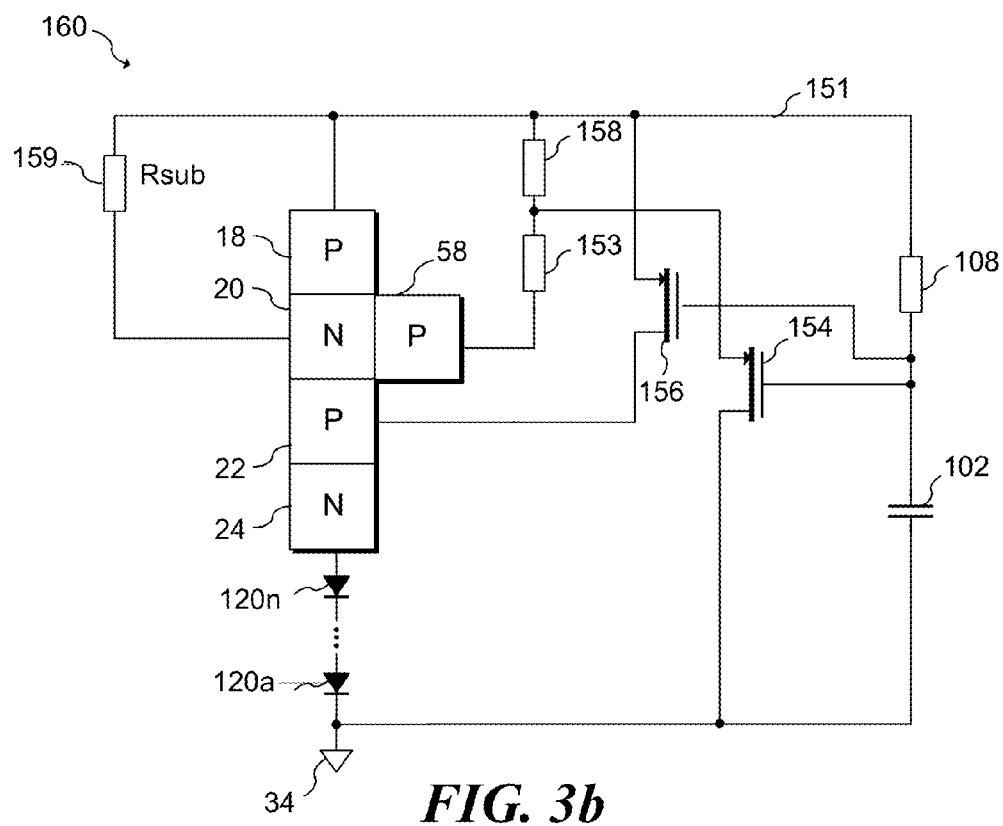

In an alternative embodiment, the other device types besides NMOS can be used, for example PMOS, BJTs, JFETS, and other transistors types. Furthermore, in an alternative embodiment, the polarity of the SCR device and or the supporting devices can be inverted. For example, in FIG. 3b, ESD device 160 having with an SCR device having a p-type region 58 adjacent to the n-type trigger region 20 can be used.

In such as case, the adjacent p-type region 58 is pulled low by PMOS source follower 154, and p-type trigger region 22 is pulled high by PMOS transistor 156 during an ESD event. Substrate resistor 159 represents the resistance Rsub of an n-type layer and/or substrate. Similar to FIG. 3a, values of resistors 153 and 158 can be chosen to adjust the trigger current of ESD device 160.

Figure 3C:
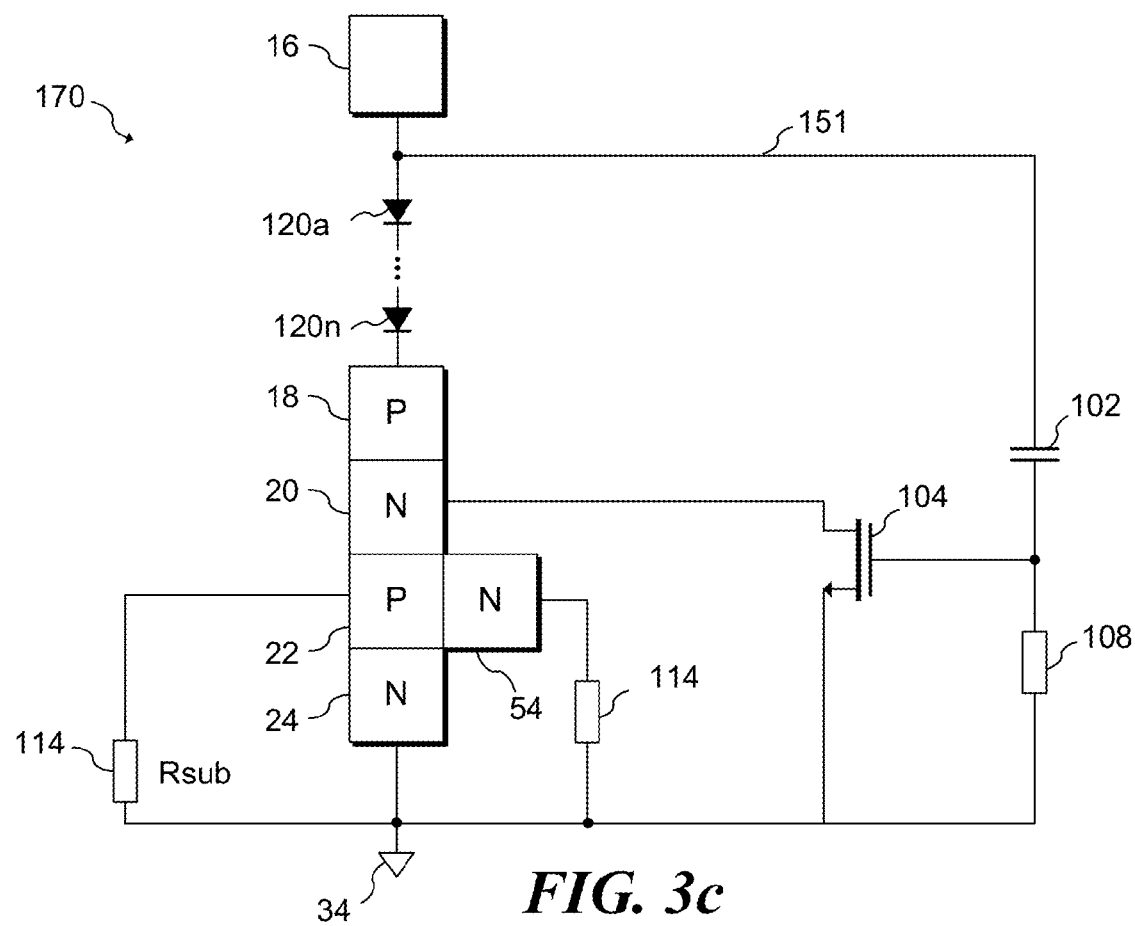

FIG. 3c illustrates ESD device 170 according to an alternative embodiment of the present invention. The embodiment of FIG. 3c is similar to the embodiment of FIG. 3a, except that n-type region 54 is coupled to ground via resistor 114 instead of being driven by a transistor. During an ESD event, the potential of n-type region 54 is at ground, the intrinsic depletion zone of the junction builds up and reaches deep into the substrate, thereby lowering the trigger current of ESD device 170. In some embodiments, the shield diode can be even forward biased during triggering. In one embodiment, the n-well of the shield diode increases the resistance of the p-well/p-substrate by reducing its effective cross-section. In an embodiment, the trigger current of ESD device 170 is lowered by adjusting the resistance of resistor 114.

Figure 3D:
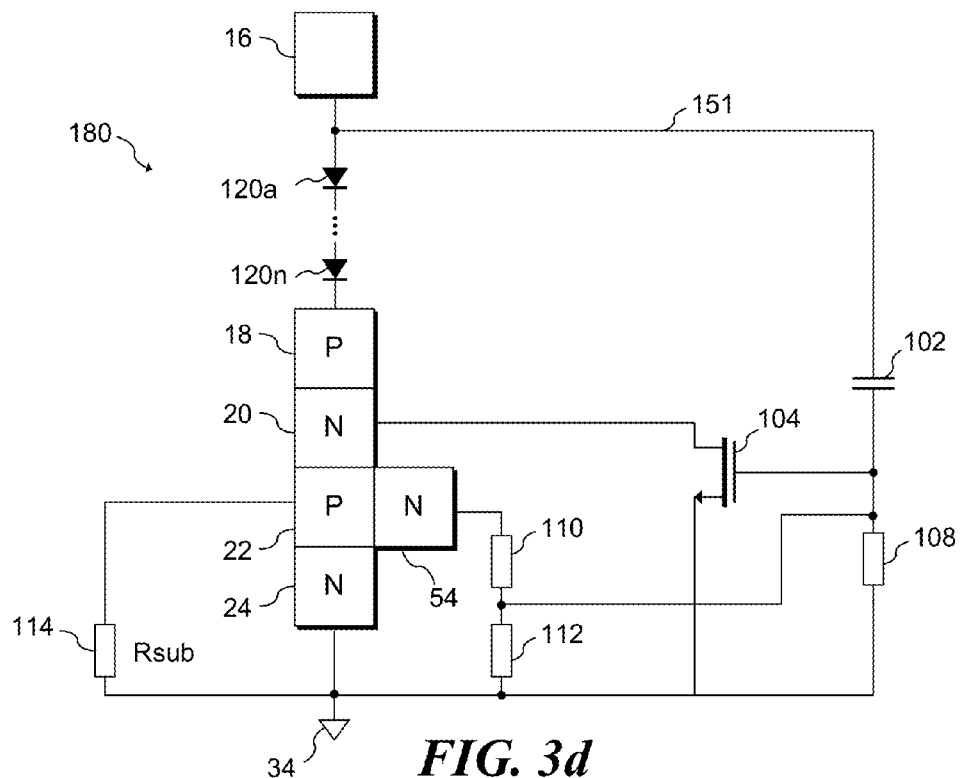

FIG. 3d illustrates ESD device 180 according to another embodiment of the present invention. The embodiment of FIG. 3d is similar to the embodiment of FIG. 3a, except that n-type region 54 is coupled directly to capacitor 102 and resistor 108 instead of through a transistor.

Figure 3E:
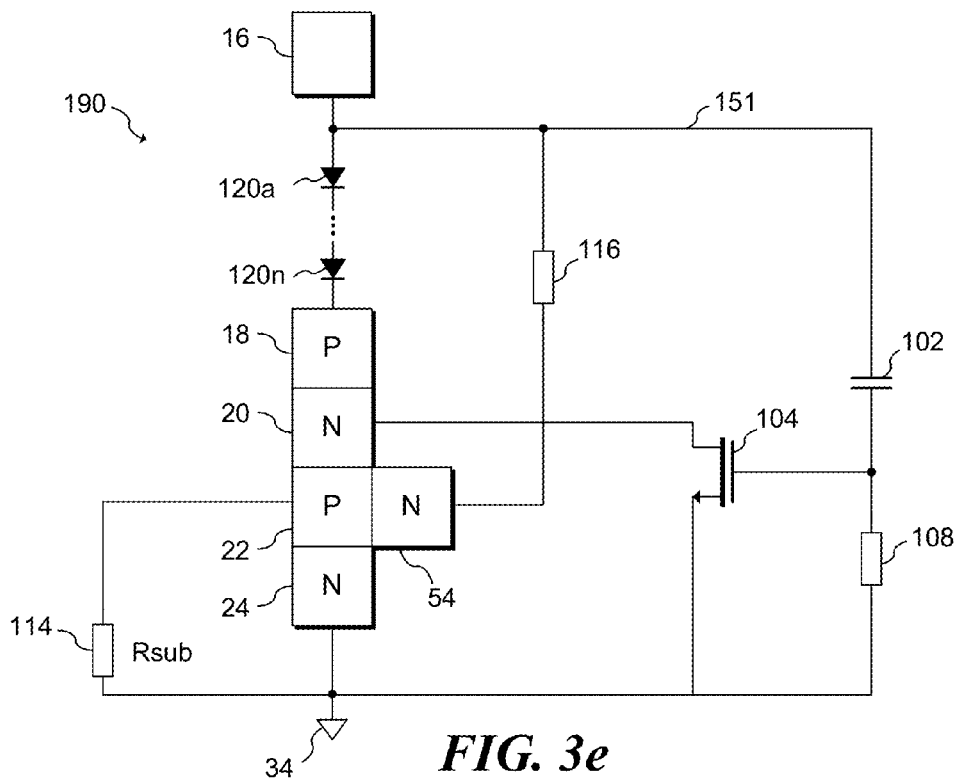

FIG. 3e illustrates ESD device 190 according to a further embodiment of the present invention. The embodiment of FIG. 3e is similar to the embodiment of FIG. 3a, except that the n-type region 54 is coupled to node 151 via resistor 116. Here, n-type region 54 is pulled high directly from node 151 during an ESD event, thereby reducing the trigger current of the SCR device.

Figure 4A:
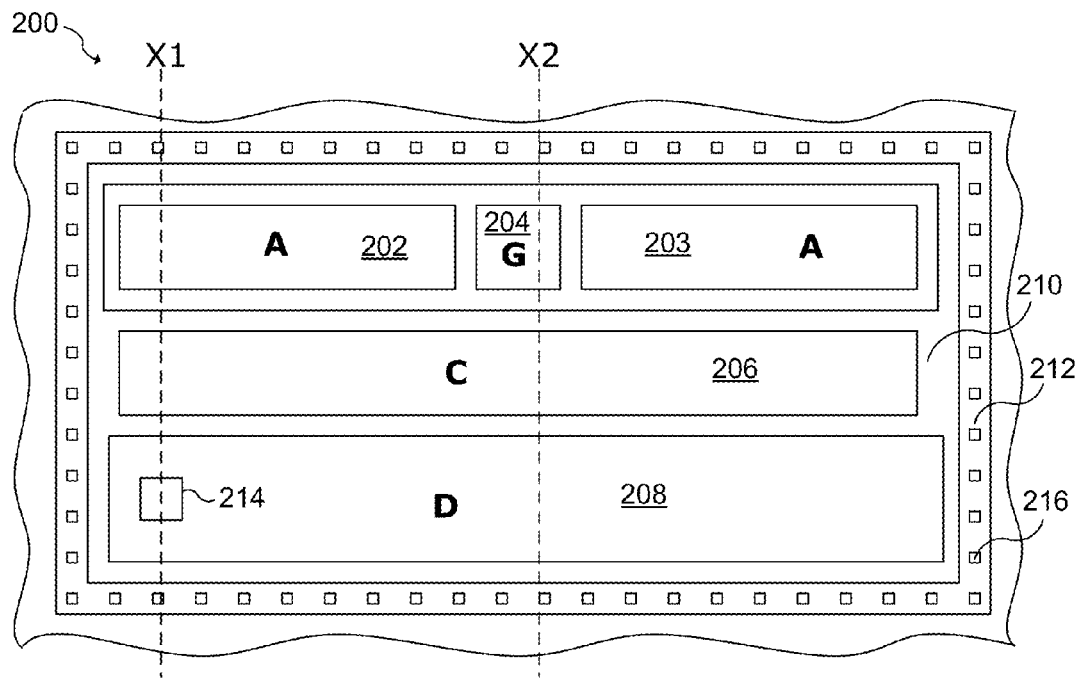
FIGS. 4a-4c illustrate an embodiment layout and cross sections of an ESD device.

FIG. 4a illustrates a layout view of SCR 200 according to an embodiment of the present invention. The anode of the SCR device is formed by p+ regions 202 and 203, the n-type trigger region is formed by n-well 205, the p-type trigger region is formed by is formed by p-well 210, the n-type cathode is formed by n+ region 206, and the adjacent n-type region is formed by n-well 208. Contact can be made to n-well 208 via n+ region 214. Here, a diode junction is formed at the boundary of n-well 208 and p-well 210, as well as at a boundary of n-well 208 and a p-type substrate beneath the n-well (not shown). An optional substrate ring formed by p+ region 212 surrounds the active portion of SCR 200. Anodes 202 and 203, trigger contact 204, cathode 206 and optional substrate ring 212 have contacts on the upper surface of these regions. Only the contacts 216 on optional substrate ring 212 are shown for clarity, however, it should be noted all of these regions can have contacts. In an embodiment, contacts to anode regions 202 and 203 are coupled to a node to be protected, cathode region 206 is coupled to ground, and trigger contact region G2 and n-type region 208 are coupled to a trigger device. For the sake of clarity of explanation herein, anode regions 202 and 203 has further been labeled A, trigger contact region 204 is labeled G, cathode region 206 is labeled C, and n-type region 208 is labeled D.

It should be noted that the embodiment layout of FIG. 4a is just one example of a layout of an embodiment ESD device. Alternative embodiments can be arranged differently with respect to dimensions and placement of the various regions, as well as the number of each of the various regions. For example, some embodiments may employ a single anode region or multiple anode regions. Some alternative embodiments may also employ multiple cathode regions and shield diode regions.

Figure 4B:
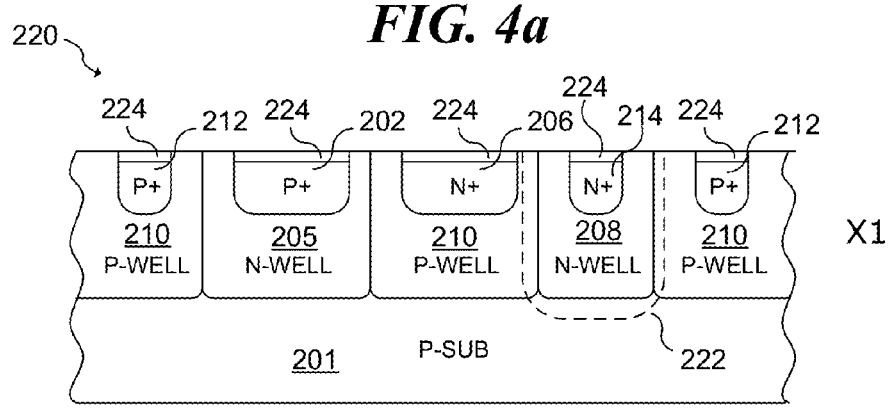

FIG. 4b illustrates cross section 220 of ESD device 200 taken at line X1 (FIG. 4a). N+ cathode region 206 and optional p+ substrate ring 212 are shown disposed in p-wells 210, and p+ anode 202 is shown disposed in n-well 205. In the depicted embodiment, p-wells 210 and n-wells 205 and 208 reside in p-type substrate 201, however, in alternative embodiments, other types of substrates, such as n-type, SOI and EPI, can be used, for example. Shield diode depletion region 222 is shown at the interface between n-well 208 and p-well 210 and at the interface between n-well 208 and p-substrate 201. Depletion region 222 and the presence of n-well 208 increases the resistance of the base of the parasitic NPN (i.e. NPN 42 in FIG. 2b). If n-well 208 is coupled to a trigger device via region 214, as disclosed herein, the resistance in the base of the parasitic NPN is further increased due to modulation in the depletion region 222.

Figure 4C:
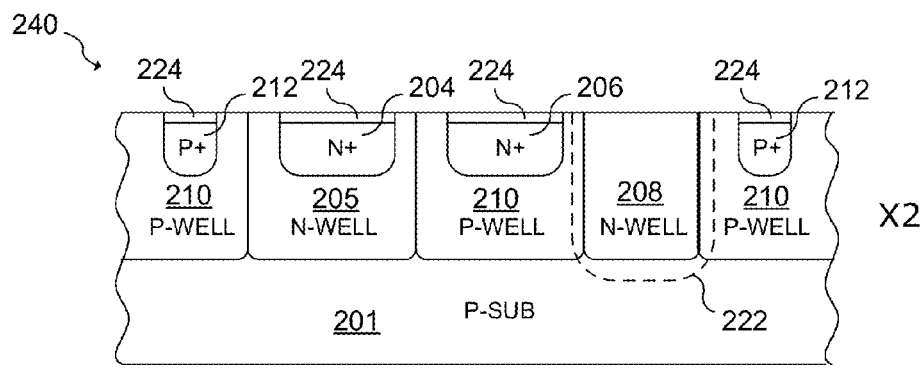

FIG. 4c, on the other hand, illustrates cross section 240 of ESD device 200 taken at line X2 (FIG. 4a). Here, N+ region 204 contacts n-well trigger region 205.

In an embodiment, N-type cathode region 206 and trigger region 204 are made from an n-type source/drain implant. In some embodiments, the cathode region 206 and trigger region 204 have the same doping so that cathode region 206 and trigger region 204 can be implanted at the same mask and processing step. For example, Arsenic ions can be implanted with a dose of about $1\times10^{14}$ cm$^{-2}$ to about $5\times10^{21}$ cm$^{-2}$ and an implant energy between about 10 keV and about 50 keV. In other embodiments, other materials, such as Phosphorus, can be implanted. The resulting doping concentration for these n-type regions is typically greater than $10^{21}$ cm$^{-3}$. In an alternative embodiment, cathode region 206 and trigger region 204 can be implemented in separate steps.

In an embodiment, p-type anode 202 and 203 and optional substrate ring 212 are made from a p-type source/drain implant. For example, boron ions can be implanted with a dose of about $5\times10^{13}$ cm$^{-2}$ to about $5\times10^{21}$ cm$^{-2}$ and an implant energy between about 5 keV and about 50 keV. In other embodiments, other materials, such as BF$_2$, can be implanted. The final doping concentration for these p-type regions is typically greater than $10^{21}$ cm$^{-3}$. Again, these p-type regions are preferably implanted at the same mask step. Alternatively, these regions may be implanted during different mask steps.

A portion of the top surface of anode regions 202 and 203, cathode region 206, optional substrate ring 212, and shield diode contact region 214 include silicided regions 224 on top of which contacts (not shown) are fabricated. These silicided regions are fabricated using conventional techniques.

In an embodiment, p-wells 210 and n-wells 205 and 208 are first fabricated in a p-type substrate 201 of a semiconductor wafer. N-type cathode region 206, n-type trigger region 204, n-type shield diode contact region 214, p-type anode 202 and 203 and p-type optional substrate ring 212 are then fabricated within these wells as shown in FIGS. 4b and 4c. Silicide 224 is formed on the surface of N-type cathode region 206, n-type trigger region 204, n-type shield diode contact region 214, p-type anode 202 and 203 and p-type optional substrate ring 212, and contacts (not shown) are then coupled to silicide layers 224. Semiconductor processing continues with the application of metallization and dielectric layers until processing is complete. Alternatively, other processing steps and sequences may me used.

Figure 5:
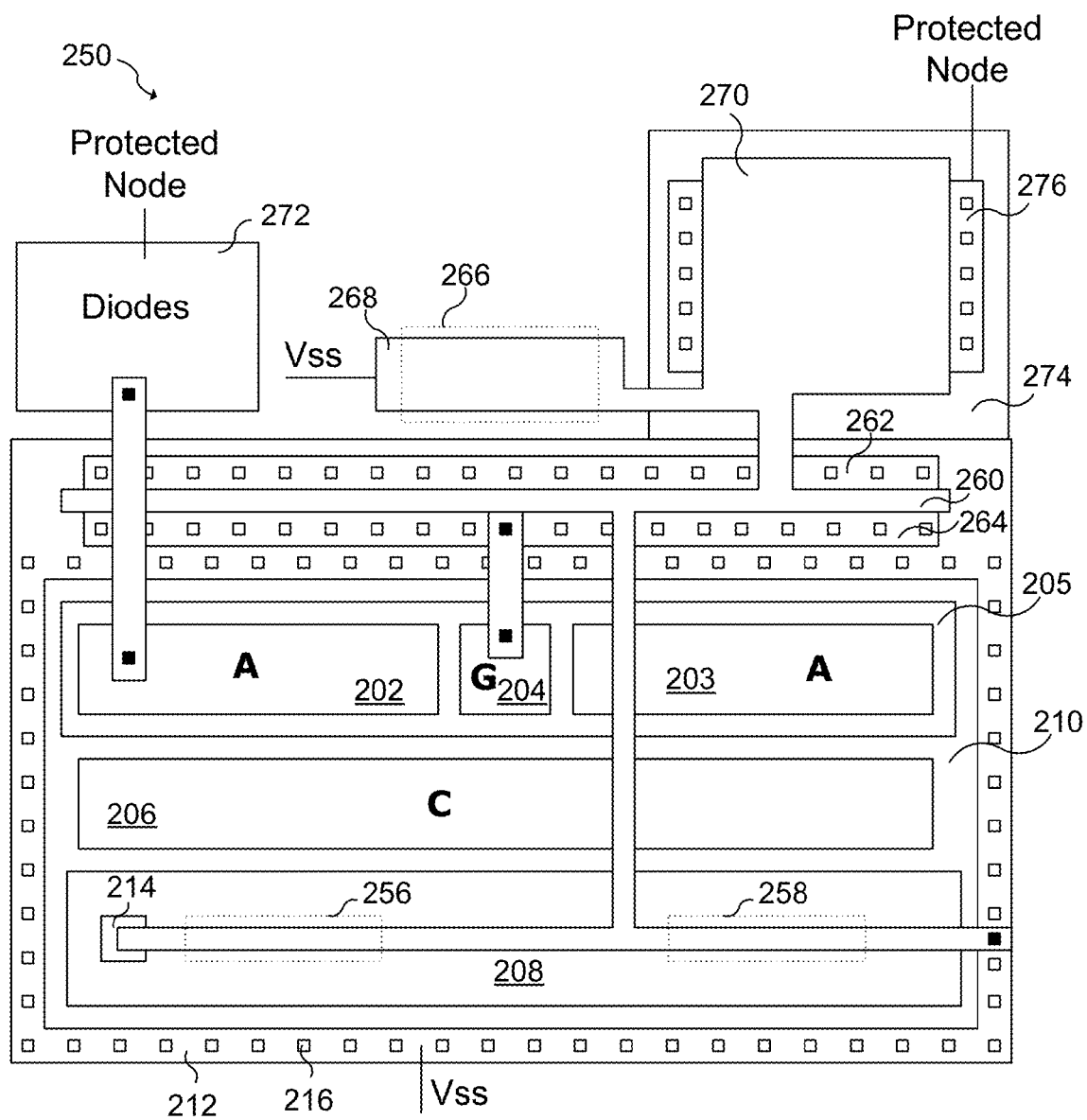
FIG. 5 illustrates a layout view according to a further embodiment of the present invention.

FIG. 5 illustrates layout view 250 of ESD device 180 shown in FIG. 3d. The core of SCR including anode regions 202 and 203, cathode region 206, shield diode region 208 is similar to the layout of FIG. 4a. Capacitor 102 is implemented as NCAP 270 having poly silicon disposed over n-well 274 and with n+ regions 276 disposed adjacent, and diodes 272 are implemented according to techniques known in the art. Resistor 108 is implemented as poly silicon resistor 268 having a blocked-silicide region 266 in which the silicide is blocked. Similarly, resistors 110 and 112 are implemented as poly silicon resistors having blocked silicided regions 256 and 258 respectively. NMOS 104 is implemented using a single striped NMOS device having poly silicon gate 260 and n+ source and drain regions 262 and 264, respectively. The resistors, NMOS device and capacitor are coupled together using a single piece of polysilicon, however, in alternative embodiments, these devices can be coupled together using different routing layers such as different levels of metal and polysilicon depending on the particular layout and device technology. The NMOS device is coupled to n-type trigger region 204 via metal interconnect 274. Other connections to regions 202, 203, 206, 210, 276, 262, 264, and 212 are not shown for simplicity of illustration, however, these regions are connected according to techniques known in the art. It should be further noted that the layout of FIG. 5 is just one example of how to layout an ESD device according to an embodiment of the present invention.

In alternative embodiments, other resistors types besides poly silicon resistors can be used to implement resistors 108, 110 and 112, such as n-well resistors. Also, other capacitor types can be used besides an NCAP to implement capacitor 102, such as MIMCAP, PMOSCAP. Furthermore, the geometry of NMOS device 104 can be different with respect to size and with respect to the number of gate stripes. It should be noted that in embodiments employing the shield diode, the size of the NMOS trigger device can be smaller than ESD devices that do not employ embodiment shield diodes. In some embodiments, the trigger device can be made smaller in that the lower trigger current achieved using embodiment shield diode techniques reduces the required trigger current to activate the ESD device. Because less current is needed to trigger the ESD device, smaller trigger devices can be used, thereby reducing layout area with respect to conventional devices.

Figure 6A:
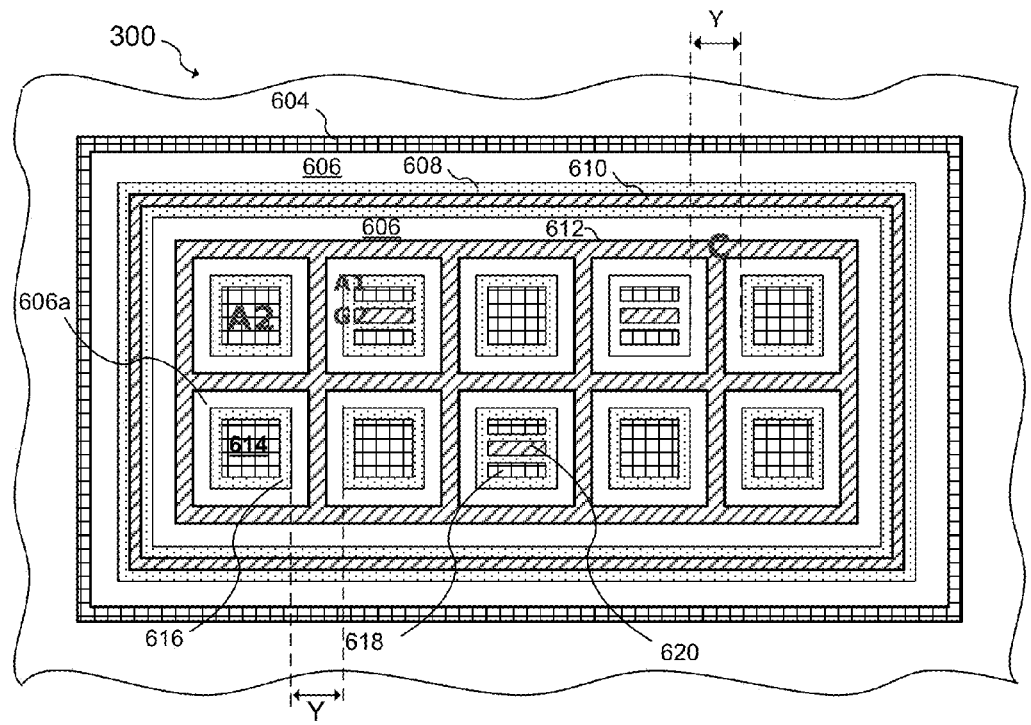
FIGS. 6a and 6b illustrate a layout view and an equivalent circuit of a 2-dimensional array-type embodiment of the present invention.

Turning to FIG. 6a, 2-dimensional array-type embodiment of ESD device 300 is shown. N+ cathode region 612 is formed as a grid that surrounds directly triggered anode regions and indirectly triggered anode regions. Each anode region has a p-base p-well region 606a and n-base n-well region 616. In alternative embodiments, however, these p-base and n-base regions may comprise other types of regions, for example substrate and EPI regions. In the directly triggered anode regions, p+ anode regions 618 (labeled A1) reside in n-well n-base regions 616 along with n+ trigger contact regions 620 (G2). In an embodiment, these regions are directly triggered by n+ trigger contact regions 620. It should be noted that n+ cathode region 612 is disposed above p-well region 606/606a, thereby allowing coupling between anodes through p-well 606/606a. In an embodiment, anode regions 618 and trigger regions 620 are sized to a minimum geometry along at least one dimension and distance Y between anode regions is preferably about 1 μm, although in alternative embodiments other dimensions may be used. In the indirectly triggered anode regions, p+ anode regions 614 reside in n-well n-base regions 616. In an embodiment, these indirectly triggered anode regions are triggered via the substrate. Anode regions 614 (labeled A2) are preferably sized larger than anode regions 618 in order to conduct higher currents, as is discussed in U.S. patent application Ser. No. 12/138,208, entitled "Semiconductor ESD Device and Method of Making Same," which is incorporated herein by reference in its entirety. In an embodiment, regions A1 are sparsely distributed with respect to regions A2.

N-well 608, which forms a shield diode region according to an embodiment of the present invention, is disposed adjacent to p-well 606/606a and surrounds the cathode region grid 612. N+ region 610 is disposed within n-well 608 in order to facilitate contact to the n-well. FIG. 6a shows n+ region 610 being a continuous region within n-well 608. Alternatively, n+ region 610 can be broken up into two or more sections within n-well 610. Optional substrate contact region 604 surrounds n-well region 608.

Figure 6B:
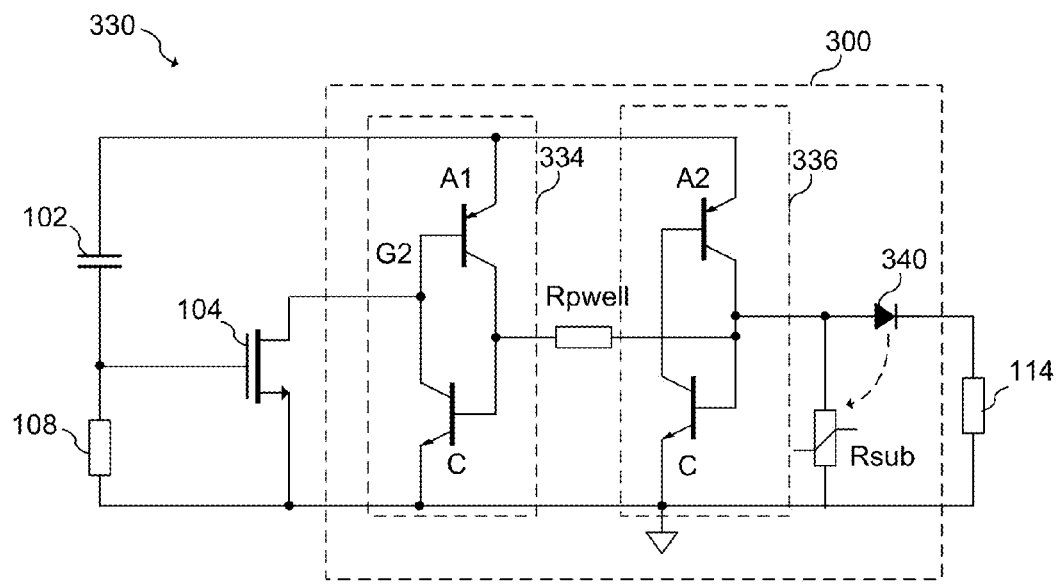

FIG. 6b shows a circuit model representation 330 of the 2-dimensional array-type ESD structure 300 shown in FIG. 6a. Bipolar latch 334 represents directly triggered anode regions and bipolar latch 336 represents indirectly triggered anode regions. Trigger device 104 is illustrated as an NMOS device 104 coupled to resistor 108 and capacitor 102 in this embodiment, however, other trigger devices, such as diodes can be used. Bipolar latch 336 is triggered by current flowing underneath cathode 612 in p-well 606a. This coupling is designated as Rpwell. The potential across shield diode 340 modulates substrate resistance Rsub. In an embodiment, the cathode of the shield diode is coupled to ground via resistor 114. Since the cathode of shield diode is at ground potential, the resistance to substrate Rsub is modulated by n-well region 608 reducing the effective cross-section of the substrate underneath, and by additionally reducing the cross-section of the p-substrate by the zero-bias depletion layer of shield diode 340. In alternative embodiments, shield diode 340 can be coupled according to the embodiments of FIGS. 3a, 3b, 3d and 3e.

Figure 7:
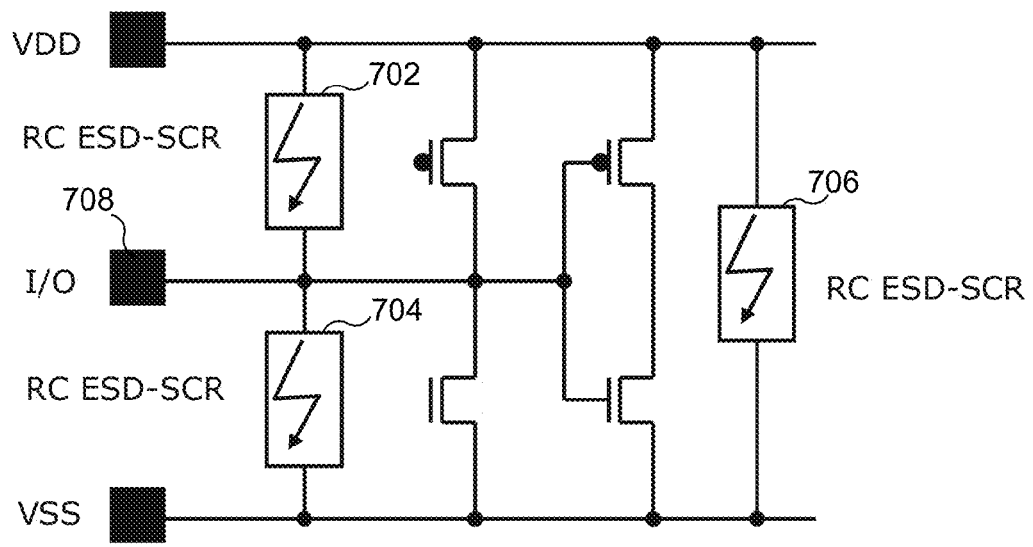
FIG. 7 illustrates an embodiment ESD protection scheme.

FIG. 7 illustrates an embodiment implementation of the ESD devices described herein. Embodiment ESD device 702 is coupled between VDD and I/O pin 708 and provides protection for I/O pin 708 against positive going ESD disturbances (i.e. positive ESD stress at VDD, IO at ground). Embodiment ESD device 704 is coupled between VSS and I/O pin 708 and provides protection for I/O pin 708 against positive ESD disturbances at IO to VSS at ground). Embodiment ESD device 706 is coupled between VDD and VSS and provides protection for the power supply.

Figure 8:
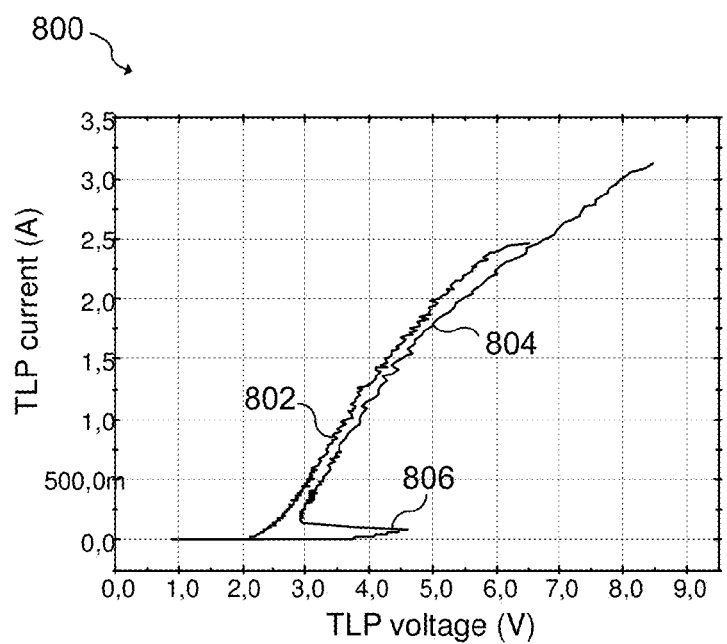
FIGS. 8-10 illustrate performance comparison graphs of embodiments of the present invention.

FIG. 8 illustrates transmission line pulse (TLP) characteristics 800 of an embodiment ESD device 802 compared to TLP characteristics of a SCR-based device 804 that does not utilize a shield diode or an MOS triggering device. The x-axis is TLP voltage, and the y-axis is TLP current. The embodiment ESD device exhibits a lower trigger current and lower trigger voltage. Furthermore, the TLP characteristics of the embodiment ESD device 802 does not exhibit latchback characteristics 806 evident in trace 804.

Figure 9:
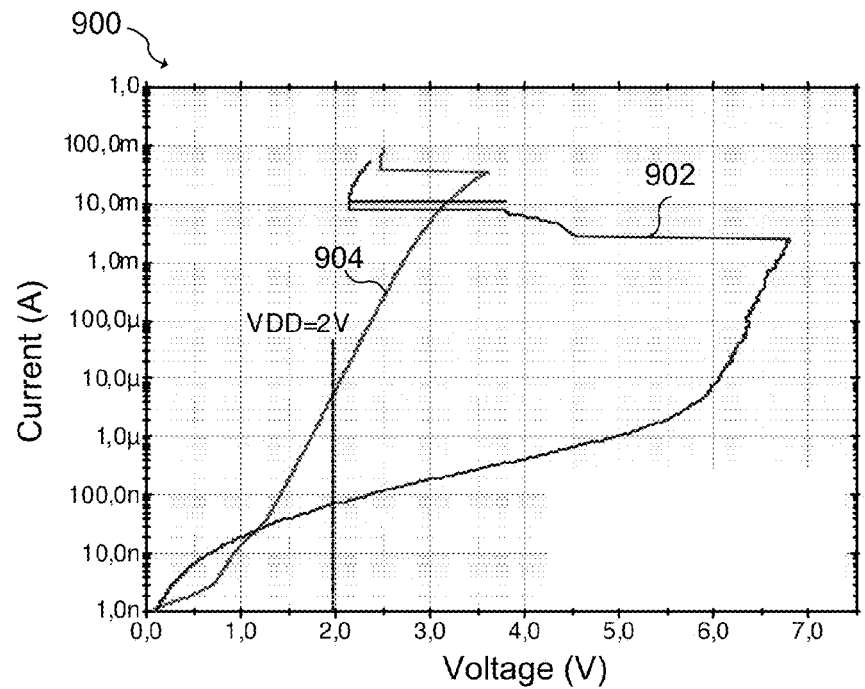

FIG. 9 illustrates a graph 900 comparing leakage characteristics at 125° C. between embodiment SCR device 902, and SCR device 904 that does not utilize an embodiment shield diode and MOSFET triggering devices. It can be seen that the embodiment ESD device consumes over ten times less leakage current at Vdd=2V than a SCR device that does not utilize an embodiment shield diode and MOSFET triggering devices.

Figure 10:
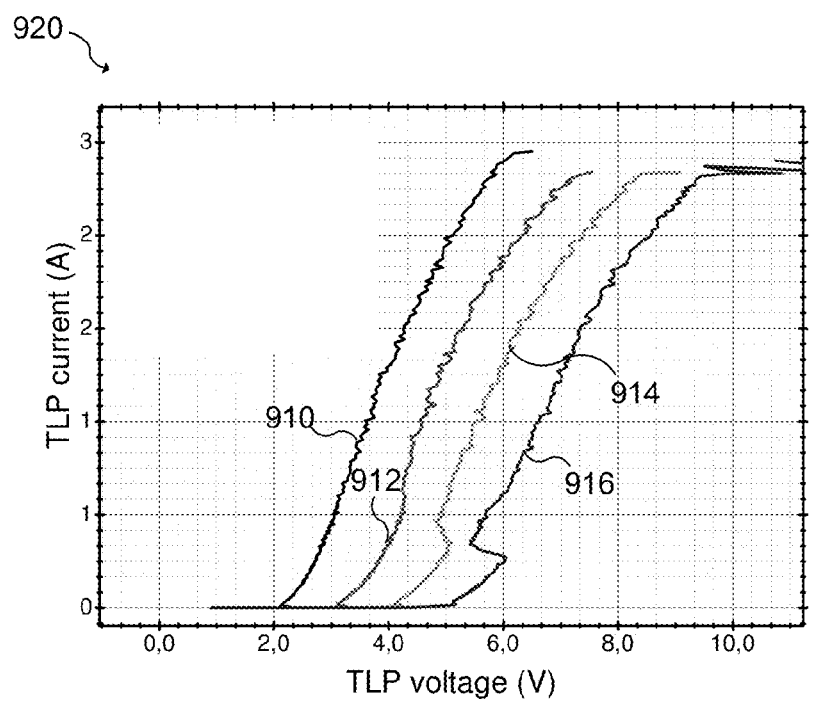

FIG. 10 illustrates TLP characterization 920 of embodiment devices according to the embodiment of FIG. 3c having different numbers of series diodes. Trace 910 represents a device having 1 series diode, trace 912 represents a device having 2 series diodes, trace 914 represents a device having 3 series diodes, and trace 916 represents a device having 4 series diodes. It can be seen that the trigger and holding voltages of an embodiment ESD device can be adjusted according to the number of series diodes.

Advantages of embodiments of the present invention include, smaller semiconductor area because a smaller trigger device is needed to source trigger current due to the reduced trigger current necessary. A further advantage of embodiments includes lower leakage current because of the lower leakage of NMOS devices.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   an ESD device region disposed within a semiconductor body;
   a first device region of a first conductivity type disposed on a second device region of a second conductivity type, the second conductivity type opposite the first conductivity type, wherein the first device region is coupled to a first ESD node, and wherein the second device region is disposed within the ESD device region;
   a third device region of the second conductivity type disposed on the second device region;
   a fourth device region of the first conductivity type adjacent to the second device region, the fourth device region disposed within the ESD device region;
   a fifth device region of the second conductivity type disposed within the fourth device region, wherein the first device region, the second device region, the fourth device region, and the fifth device region forming a silicon controlled rectifier (SCR), wherein the fifth device region is coupled to a second ESD node; and
   a sixth device region of the second conductivity type adjacent to the fourth device region, wherein the fourth device region and the sixth device region contact at a shared interface to form a diode junction.

2. The semiconductor device of claim 1, wherein a bias voltage of the diode junction modulates a trigger current of the SCR.

3. The semiconductor device of claim 1, wherein a depletion region of diode junction modulates a trigger current of the SCR.

4. The semiconductor device of claim 1, wherein
   the first conductivity type is p-type and the second conductivity type is n-type;
   the first device region comprises an anode of the SCR; and
   the fifth device region comprises a cathode of the SCR.

5. The semiconductor device of claim 4, wherein the second device region comprises an n-well.

6. The semiconductor device of claim 1, wherein:
   the sixth device region is coupled to the second ESD node, and
   the SCR device is configured to be triggered via the sixth device region.

7. The semiconductor device of claim 1, wherein the sixth device region is coupled to the first ESD node.

8. The semiconductor device of claim 1, further comprising:
   a RC circuit comprising a first resistor coupled to a capacitor; and
   a second transistor comprising:
      a control node coupled to the RC circuit, and
      a first output node coupled to the sixth device region.

9. The semiconductor device of claim 8, wherein the second transistor comprises a MOSFET.

10. The semiconductor device of claim 1, further comprising:
    a RC circuit comprising a first resistor coupled to a capacitor;
    a first transistor comprising:
       a control node coupled to the RC circuit; and
       a first output node coupled to the third device region.

11. The semiconductor device of claim 10, further comprising a second transistor comprising:
    a control node coupled to the RC circuit; and
    a first output node coupled to the sixth device region.

12. The semiconductor device of claim 1, further comprising at least one diode coupled in series with the first device region and the first ESD node.

13. The semiconductor device of claim 1, further comprising a substrate contact coupled to the semiconductor body, wherein the substrate contact is configured to be coupled to a ground potential.

14. A semiconductor device comprising:
    an ESD device region disposed within a semiconductor body;
    a first device region of a first conductivity type disposed on a second device region of a second conductivity type, the second conductivity type opposite the first conductivity type, wherein the first device region is coupled to a first ESD node, and wherein the second device region is disposed within the ESD device region;
    a third device region of the second conductivity type disposed on the second device region;
    a fourth device region of the first conductivity type adjacent to the second device region, the fourth device region disposed within the ESD device region;
    a fifth device region of the second conductivity type disposed within the fourth device region, wherein the first device region, the second device region, the fourth device region, and the fifth device region forming a silicon controlled rectifier (SCR), wherein the fifth device region is coupled to a second ESD node; and
    a sixth device region of the second conductivity type adjacent to the fourth device region, wherein, an interface between the fourth device region and the sixth device region forms a diode junction;
    a RC circuit comprising a first resistor coupled to a capacitor;
    a first transistor comprising:
       a control node coupled to the RC circuit; and
       a first output node coupled to the third device region;
    a second transistor comprising:
       a control node coupled to the RC circuit; and
       a first output node coupled to the sixth device region, wherein:
    the first output node of the second transistor is coupled to the sixth device region via a second resistor; and
    the first output node of the second transistor is further coupled to the second ESD node via a third resistor.

15. The semiconductor device of claim 14, wherein the first transistor and the second transistor comprise MOSFETs.

16. An ESD device comprising
    a silicon controller rectifier (SCR) comprising:
       a p-type anode region,
       an n-type first trigger region coupled to the p-type anode region, a p-type second trigger region coupled to the n-type first trigger region, an n-type cathode region coupled to the p-type second trigger region, and a further n-type region coupled to the p-type second trigger region, wherein an interfacial area between the further n-type region and the p-type second trigger region forms a diode junction, and wherein a trigger current of the SCR is modulated by a bias voltage of the diode junction;

a trigger device comprising:
 a first MOSFET comprising a first output node coupled to the p-type second trigger region; and
 a second MOSFET comprising a first output coupled to the n-type second trigger region.

17. The ESD device of claim 16, further comprising an RC network coupled between the SCR p-type anode region and the SCR n-type cathode region, the RC network having an output coupled to a gate of the first MOSFET and a gate of the second MOSFET.

18. The ESD device of claim 17, wherein the RC network comprises:
 a capacitor having a first terminal coupled to the SCR p-type anode region and a second terminal coupled to the output of the RC network; and
 a resistor having a first terminal coupled to a second terminal of the capacitor and a second terminal coupled to the SCR n-type cathode region.

19. The ESD device of claim 18, wherein the RC network has a time constant of between about 1 ns and about 1 µs.

20. The ESD device of claim 16, further comprising a diode coupled between the first output node of the first MOSFET and the p-type second trigger region.

21. The ESD device of claim 20, wherein:
 an anode of the diode and the p-type second trigger region comprise a same semiconductor region; and
 a turn-on current of the SCR is controlled by a bias voltage of the diode junction.

22. The ESD device further comprising at least one diode coupled in series with the p-type anode region.

23. An ESD device comprising:
 a silicon controller rectifier (SCR) comprising:
  a p-type anode region,
  an n-type first trigger region coupled to the p-type anode region,
  a p-type second trigger region coupled to the n-type first trigger region,
  an n-type cathode region coupled to the p-type second trigger region, and
  a further n-type region coupled to the p-type second trigger region, wherein an interface between the p-type second trigger region forms a diode junction, and wherein a trigger current of the SCR is modulated by a bias voltage of the diode junction;
 a trigger device comprising:
  a first MOSFET comprising a first output node coupled to the p-type second trigger region; and
  a second MOSFET comprising a first output coupled to the n-type second trigger region; wherein:
 the p-type anode region comprises a plurality of anode regions;
 the n-type first trigger region comprises a plurality of n-type first trigger regions, wherein ones of the p-type anode regions are disposed within ones of the plurality of n-type first trigger regions;
 the p-type second trigger region comprises a plurality of first p-type second trigger regions, wherein one of the plurality of first p-type second trigger regions surrounds one of the plurality of n-type first trigger regions;
 the n-type cathode region comprises a grid shaped region comprising a plurality of grid elements, each grid element surrounding each of the plurality of first p-type second trigger regions;
 the p-type second trigger regions further comprises a second p-type second trigger region surrounding the n-type cathode region; and
 the further n-type region surrounds the second p-type second trigger region.

24. The ESD device of claim 23, wherein the plurality of n-type first trigger regions comprise a first plurality of n-type first trigger regions and a second plurality of n-type first trigger regions, wherein the second plurality of n-type first trigger regions each comprise a trigger contact, and wherein the second plurality of n-type first trigger regions are sparsely distributed with respect to the first plurality of n-type first trigger regions.

25. The ESD device of claim 23, wherein
 the n-type first trigger region comprises an n-well;
 the p-type first trigger region comprises a p-well; and
 the further n-type region comprises an n-well.

26. A method of operating a semiconductor device, the method comprising:
 providing a protection device at a protected node, the protected node being coupled to circuitry in a semiconductor substrate, wherein the protected node is coupled to an anode of a SCR device, the SCR comprising
  a p-type anode region,
  an n-type first trigger region coupled to the p-type anode region,
  a p-type second trigger region coupled to the n-type first trigger region, and
  an n-type cathode region coupled to the p-type second trigger region,
  a further n-type region coupled to the p-type second trigger region, wherein an interfacial area between the further n-type region and the p-type second trigger region forms a diode junction, and wherein a trigger current of the SCR device is modulated by a bias voltage of the diode junction; and
 protecting the circuitry from a high voltage, wherein when the high voltage reaches a level that is greater than an operating level, the protection device causes a current to flow from a trigger device coupled to the further n-type region in the SCR device, for providing the bias voltage, and to the p-type first trigger region of the SCR device, wherein when the current from the trigger device flows into p-type first trigger region of the SCR, the SCR latches, causing a high current to flow from the p-type anode regions of the SCR device to the n-type cathode region of the SCR device.

27. The method of claim 26, wherein the trigger device comprises a MOSFET comprising an output node coupled to the p-type first trigger region and a gate coupled to an RC network, the RC network coupled between the p-type anode region and the n-type cathode region.

* * * * *

UNITED STATES PATENT AND TRADEMARK OFFICE
CERTIFICATE OF CORRECTION

PATENT NO. : 8,456,785 B2
APPLICATION NO. : 12/911582
DATED : June 4, 2013
INVENTOR(S) : Domanski et al.

It is certified that error appears in the above-identified patent and that said Letters Patent is hereby corrected as shown below:

In the Claims:

In Col. 11, line 35, claim 22, after "device" insert --of claim 16,--.
In Col. 11, line 47, claim 23, after "between the" insert --further n-type region and the--.

Signed and Sealed this
Third Day of September, 2013

Teresa Stanek Rea
*Acting Director of the United States Patent and Trademark Office*